(12) United States Patent
Zundel et al.

(10) Patent No.: US 11,239,188 B2
(45) Date of Patent: Feb. 1, 2022

(54) TERMINAL STRUCTURE OF A POWER SEMICONDUCTOR DEVICE

(71) Applicant: Infineon Technologies AG, Neubiberg (DE)

(72) Inventors: Markus Zundel, Egmating (DE);
Rainer Pelzer, Wernberg (AT);
Manfred Schneegans, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 333 days.

(21) Appl. No.: 15/817,810

(22) Filed: Nov. 20, 2017

(65) Prior Publication Data

US 2018/0145045 A1 May 24, 2018

(30) Foreign Application Priority Data

Nov. 21, 2016 (DE) .......................... 102016122318.2

(51) Int. Cl.
*H01L 23/00* (2006.01)

(52) U.S. Cl.
CPC .............. *H01L 24/05* (2013.01); *H01L 24/03* (2013.01); *H01L 24/45* (2013.01); *H01L 24/48* (2013.01);
(Continued)

(58) Field of Classification Search
CPC ..... H01L 2224/035; H01L 2224/03502; H01L 2224/0361–03614; H01L 2224/03622;
(Continued)

(56) References Cited

U.S. PATENT DOCUMENTS 4,988,423 A 1/1991 Yamamoto et al.
5,578,522 A * 11/1996 Nakamura ........ H01L 29/41716
438/138

(Continued)

FOREIGN PATENT DOCUMENTS

DE 102004059389 A1 * 6/2006 ............. H01L 24/05
DE 102006052202 B3 2/2008
(Continued)

OTHER PUBLICATIONS

Joshi, Ravi, et al., "Power Metallization Structure for Semiconductor Devices", U.S. Appl. No. 16/048,667, filed Jul. 30, 2018.

*Primary Examiner* — Vincent Wall
(74) *Attorney, Agent, or Firm* — Murphy, Bilak & Homiller, PLLC

(57) ABSTRACT

A power semiconductor device includes a semiconductor body configured to conduct a load current. A load terminal electrically connected with the semiconductor body is configured to couple the load current into and/or out of the semiconductor body. The load terminal includes a metallization having a frontside and a backside. The backside interfaces with a surface of the semiconductor body. The frontside is configured to interface with a wire structure having at least one wire configured to conduct at least a part of the load current. The frontside has a lateral structure formed at least by at least one local elevation of the metallization. The local elevation has a height in an extension direction defined by a distance between the base and top of the local elevation and, in a first lateral direction perpendicular to the extension direction, a base width at the base and a top width at the top.

13 Claims, 11 Drawing Sheets

(52) U.S. Cl.
CPC ............. *H01L 2224/02166* (2013.01); *H01L 2224/03462* (2013.01); *H01L 2224/03614* (2013.01); *H01L 2224/04042* (2013.01); *H01L 2224/05017* (2013.01); *H01L 2224/4502* (2013.01); *H01L 2224/48463* (2013.01); *H01L 2924/00014* (2013.01); *H01L 2924/10157* (2013.01); *H01L 2924/13055* (2013.01); *H01L 2924/13091* (2013.01)

(58) Field of Classification Search
CPC . H01L 2224/05556; H01L 2224/04042; H01L 2224/03903; H01L 2224/05557
See application file for complete search history.

(56) References Cited

U.S. PATENT DOCUMENTS

| | | | |
|---|---|---|---|
| 6,362,525 | B1 | 3/2002 | Rahim |
| 6,544,880 | B1* | 4/2003 | Akram ............. H01L 23/53238 257/E21.508 |
| 6,576,539 | B1* | 6/2003 | Lin ........................ H01L 24/11 257/E21.508 |
| 7,071,537 | B2* | 7/2006 | Kelberlau ........... H01L 29/0657 257/481 |
| 9,196,560 | B2 | 11/2015 | Roth et al. |
| 9,397,022 | B2 | 7/2016 | Roth et al. |
| 9,831,206 | B2 | 11/2017 | Raravikar et al. |
| 10,304,782 | B2 | 5/2019 | Mataln et al. |
| 2001/0036804 | A1 | 11/2001 | Mueller et al. |
| 2002/0149118 | A1* | 10/2002 | Yamaguchi ............. H01L 24/11 257/778 |
| 2002/0149958 | A1 | 10/2002 | Kunikiyo |
| 2005/0179068 | A1 | 8/2005 | Rueb et al. |
| 2005/0239277 | A1 | 10/2005 | Mercer et al. |
| 2007/0222087 | A1 | 9/2007 | Lee et al. |
| 2007/0228543 | A1 | 10/2007 | Walter et al. |
| 2008/0001162 | A1* | 1/2008 | Hackenberger ... H01L 21/32139 257/99 |
| 2010/0207237 | A1 | 8/2010 | Yao et al. |
| 2010/0314725 | A1 | 12/2010 | Gu et al. |
| 2012/0199899 | A1 | 8/2012 | Kobayashi et al. |
| 2012/0235278 | A1* | 9/2012 | Shigihara ................ H01L 24/03 257/532 |
| 2013/0203214 | A1 | 8/2013 | Isobe et al. |
| 2014/0061823 | A1 | 3/2014 | Kam et al. |
| 2015/0115391 | A1 | 4/2015 | Roth et al. |
| 2015/0348987 | A1 | 12/2015 | Lee et al. |
| 2017/0098620 | A1* | 4/2017 | Roth ....................... H01L 24/48 |
| 2018/0145045 | A1 | 5/2018 | Zundel et al. |

FOREIGN PATENT DOCUMENTS

| | | |
|---|---|---|
| DE | 102010061189 A1 | 6/2011 |
| DE | 102012109995 A1 | 4/2014 |
| DE | 102015219183 A1 | 4/2017 |
| DE | 102016122318 A1 | 5/2018 |
| JP | H01309340 A | 12/1989 |
| WO | 2016024946 A1 | 2/2016 |

* cited by examiner

TERMINAL STRUCTURE OF A POWER SEMICONDUCTOR DEVICE

TECHNICAL FIELD

This specification refers to embodiments of a power semiconductor device and to embodiments of a method of processing a power semiconductor device. In particular, this specification is directed to embodiments of a terminal structure of a power semiconductor device and to corresponding embodiments of a processing method.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, a power semiconductor device may be controllable; e.g., the load current path may be controlled by means of an insulated electrode, sometimes referred to as gate electrode. For example, upon receiving a corresponding control signal, e.g., from a driver unit, the control electrode may set the power semiconductor device in one of a conducting state and a blocking state.

In some cases, the gate electrode may be included within a trench of the power semiconductor device, wherein the trench may exhibit, e.g., a stripe configuration or a cellular configuration.

Further, a power semiconductor device may be integrated into a load current transmission path that may include cables, wires and so forth. In order to couple the power semiconductor device with components of the load current transmission path, at least one of said load terminals may comprise a contact pad or the like configured to be contacted by one or more bond wires.

Occasionally, establishing contact between a bond wire and a load terminal structure—commonly referred to as bonding—involves inducing thermal mechanical stress within load terminal structure.

SUMMARY

According to an embodiment, a power semiconductor device comprises: a semiconductor body configured to conduct a load current; a first load terminal electrically connected with the semiconductor body and configured to couple the load current into and/or out of the semiconductor body, wherein the first load terminal comprises a metallization having a frontside and a backside, the backside interfacing with a surface of the semiconductor body and the frontside being configured to interface with a wire structure having at least one wire configured to conduct at least a part of the load current. The frontside of the metallization has a lateral structure that is formed at least by at least one local elevation of the metallization. The at least one local elevation has a height in an extension direction defined by the distance between a base and a top of the local elevation and, in a first lateral direction perpendicular to the extension direction, a base width at the base and a top width at the top. The top width amounts to less than 90% of the base width.

According to a further embodiment, a method of processing a power semiconductor device comprises: providing a semiconductor body configured to conduct a load current; forming a first load terminal electrically connected with the semiconductor body and configured to couple the load current into and/or out of the semiconductor body, wherein the first load terminal comprises a metallization having a frontside and a backside, the backside interfacing with a surface of the semiconductor body and the frontside being configured to interface with a wire structure having at least one wire configured to conduct at least a part of the load current. Forming the first load terminal further includes laterally structuring the frontside of the metallization by forming at least one local elevation of the metallization, the at least one local elevation having a height in an extension direction defined by the distance between a base and a top of the local elevation and, in a first lateral direction perpendicular to the extension direction, a base width at the base and a top width at the top, wherein the local elevation is formed such that the top width amounts to less than 90% of the base width.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
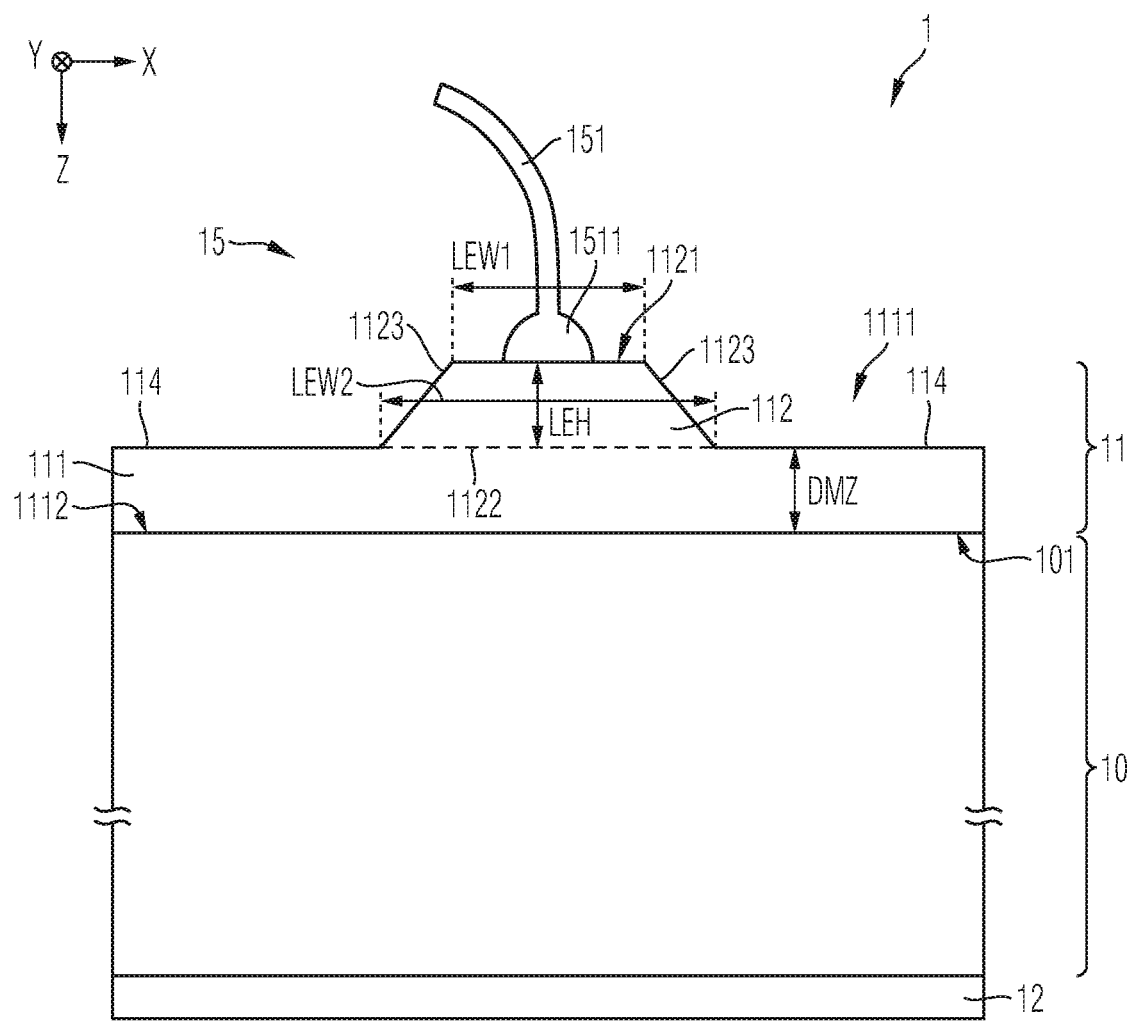
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or cellular cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V. For example, the processed semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1 schematically and exemplarily illustrates a section of a vertical cross-section of a power semiconductor device 1 in accordance with one or more embodiments.

The power semiconductor device comprises a semiconductor body 10 configured to conduct a load current. For example, the semiconductor body 10 may be based on silicon or, respectively, silicon carbide. Further, the semiconductor body 10 can be based on epitaxial layers. For example, in order to conduct the load current, the semiconductor body 10 may be equipped with a number of semiconductor power cells (not illustrated). The number of power cells can comprise at least one diode cell and/or at least one transistor cell. For example, the at least one transistor cell can be one of an IGBT cell, a MOSFET cell and/or an RC-IGBT cell or can exhibit a configuration derived from an IGBT or a MOSFET configuration. However, the present specification is not limited to specific kind of configuration of the semiconductor body 10 and the number and the configuration of the power cells it may include. For example, the load current to be conducted by the semiconductor body 10 amounts to at least 100 mA, or to at least 10 A, or to even more than 200 A. Further, the load current may be conducted within the semiconductor body 10 along a path substantially in parallel to the extension direction Z.

A first load terminal 11 can be electrically connected with the semiconductor body 10 and can be configured to couple the load current into and/or out of the semiconductor body 10. The first load terminal 11 may be arranged on a frontside of the power semiconductor device 1. A second load terminal 12 can be arranged separately from the first load terminal 11, wherein also the second load terminal 12 can be configured to couple the load current into and/or out of the semiconductor body 10.

In the embodiment as illustrated in FIG. 1, the second load terminal 12 is arranged at the backside of the power semiconductor device 1. For example, the second load terminal 12 comprises a backside metallization. However, it shall be understood that, in accordance with other embodiments, also the second load terminal 12 may be arranged at the frontside of the power semiconductor device 1 or, respectively, at another side of the device 1.

In an embodiment, the first load terminal 11 forms a source terminal, and the second load terminal 12 may form one of a drain terminal or collector terminal.

Further, said number of power cells that may be included in the semiconductor body 10 may each comprise a first semiconductor port region and a second semiconductor port region, wherein the respective first semiconductor port region may be electrically connected to the first load terminal 11, and wherein the respective second semiconductor port region may be electrically connected to the second load terminal 12. Further, each of said number of power cells may comprise a respective pn-isolation formed in between said semiconductor port regions. Just to give a few examples, the semiconductor port regions may comprise at least one of a semiconductor source region, a semiconductor channel region, a semiconductor body region, a semiconductor emitter region, and a semiconductor drain region. Further, the power semiconductor device may comprise a gate pad region.

In the event that at least one of the number of power cells is a controllable power cell, such as a transistor cell, a thyristor cell, and MOS gated diode (MGD) cell or the like, the power semiconductor device 1 may further comprise a control terminal (not illustrated) configured to receive a control signal from external of the power semiconductor device 1, e.g., from a driver unit. For example, the control terminal be electrically connected with one or more control electrodes that are arranged and configured to control semiconductor regions within the semiconductor body 10. For example, the control signal may comprise a voltage difference applied between the control terminal and the first load terminal 11, e.g., a gate-source-voltage.

However, aspects of the present specification are rather directed to exemplary configurations of the first load terminal 11, which may be arranged at the frontside of the power semiconductor device 1.

The first load terminal 11 may comprise a metallization 111 having a frontside 1111 and a backside 1112, wherein the backside 1112 can interface with a surface 101 of the semiconductor body 10 and the frontside 1111 can be configured to interface with a wire structure 15 having at least one wire 151 configured to conduct at least a part of the load current. For example, the at least one wire 151 is a bondwire. It may exhibit an end 1511 which may be coupled to the first load terminal 11 by means of at least one of ball-bonding, wedge bonding and clip soldering, in accordance with an embodiment. The interface between the backside 1112 and the surface 101 of the semiconductor body 10 may comprise one or more intermediated layers, e.g., a diffusion barrier or the like. Thus, it shall be understood that the backside 1112 and the surface 101 must not necessarily be arranged in direct contact with each other.

In an embodiment, the backside 1112 covers the entire active region, i.e., the entire cell field of the semiconductor body 10 that comprises the number of power cells.

In an embodiment, the material of the metallization 111 comprises at least one of copper, gold, aluminum and nickel. For example, the metallization 111 can be made of copper, gold, aluminum and/or nickel.

The frontside 1111 of the metallization 111 can exhibit a lateral structure that is formed at least by at least one local elevation 112 of the metallization 111. The at least one local elevation 112 has a height LEH in the extension direction Z defined by the distance between a base 1122 and a top 1121 of the local elevation 112 and, in the first lateral direction X perpendicular to the extension direction Z, a base width LEW2 at the base 1122 and a top width LEW1 at the top 1121.

For example, the top width LEW1 is greater than at least 120% of a diameter of the wire end 1511, e.g., a bond ball diameter, e.g., greater than at least 200% of said diameter. For example, the top width LEW1 by amounts to at least 50 µm, to at least 100 µm, or to at least 200 µm. Further, in an embodiment, the base width LEW2 is greater than at least 150% of a diameter of the wire end 1511, e.g., a bond ball diameter, e.g., greater than at least 200% of said diameter. For example, the base width LEW2 amounts to at least 70 µm, to at least 120 µm, or to at least 250 m.

Figure 4:
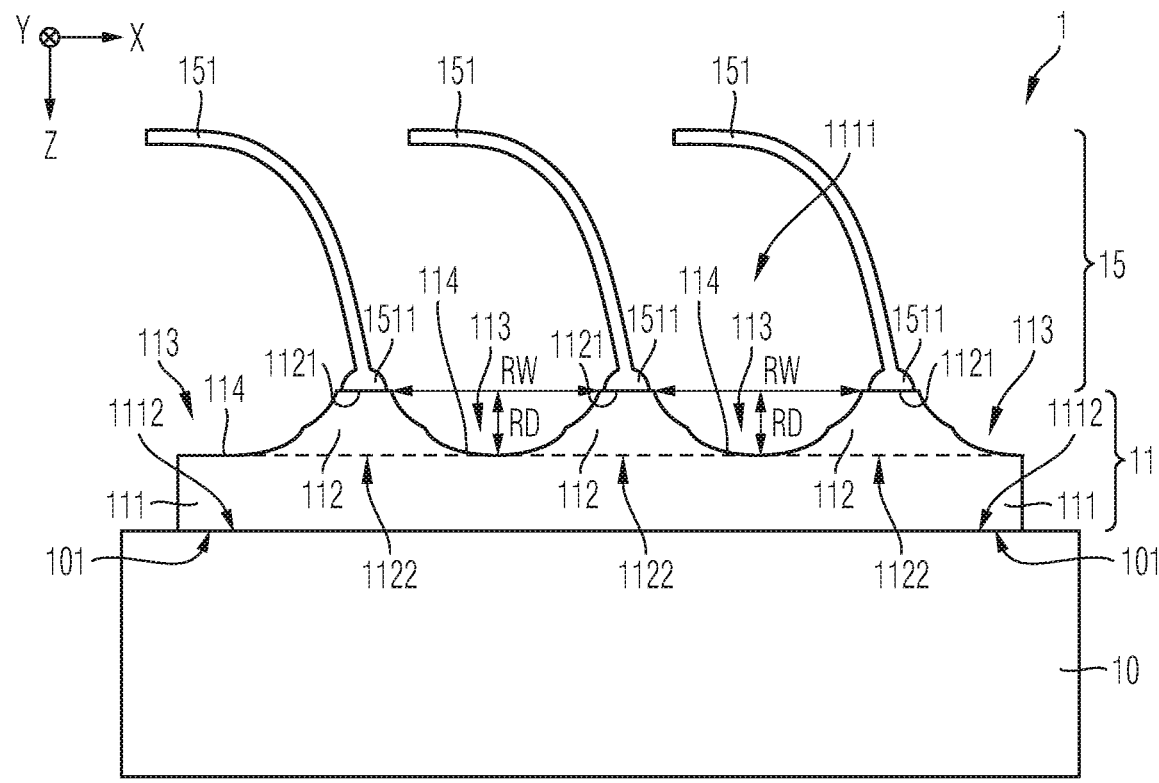
FIGS. 4-5 each schematically and exemplarily illustrate a section of a vertical cross-section of a power semiconductor device in accordance with one or more embodiments.

In an embodiment, the number of local elevations 112 is identical to the number of wires 151 of the wire structure 15; i.e., a respective one local elevation 112 is provided for each one of the wires 151 (cf. e.g., FIG. 4). However, for reasons of simplicity, and the following it is always referred to "the at least one local elevation 112", wherein it shall be understood that what is explained with respect to this local elevation 112 may also apply analogously to the other local elevations 112 of the metallization that may be present.

For example, the top 1121 of the at least one local elevation 112 can form a contact surface configured to be contacted by the first end 1511 of the at least one wire 151. As has been indicated above, the wire 151 may be attached to the top 1121 by means of bonding, e.g., by means of at least one of ball-bonding, wedge bonding and clip soldering. The top 1121 may exhibit a top area that is adapted to the dimensions of the first end 1511 of the at least one wire 151.

Regarding the base 1122 of the at least one local elevation 112, it shall be understood that the frontside 1111 of the metallization 111 can be further formed by a base surface 114 arranged coplanar with the base 1122, as illustrated in FIG. 1. The base surface 114 may be a planar base surface 114. Each of the base surface 114 and the base 1122 may be arranged horizontally, e.g., in parallel to each of the first lateral direction X and the second lateral direction Y.

The lateral structure of the frontside 1111 of the metallization 111 that is formed by at least the local elevation 112 and the base surface 114 may be present in the form of a mesa topography, wherein such mesa topography may be produced by means of carrying out one or more embodiments of the method described further below.

For example, the area of the base 1122 of the at least one local elevation 112 amounts to less than a fraction of the area of the base surface 114. For example, the quotient between the area of the base surface 114 and the area of the base 1122 of the at least one local elevation 112 amounts to at least three, to at least ten, or to even more than 100.

For example, the section of the metallization 111 that is terminated by the base surface 114 has a depth DMZ along the extension direction Z that may be within the range of 5 μm to 20 μm or within the range of 20 μm to 50 μm. For example, the depth DMZ is substantially constant within the entire section of the metallization 111 that is terminated by the base surface 114. In another embodiment, the depth DMZ varies, e.g., due to a local topography of metal over one or more steps or due to one or more contact holes.

For example, the local elevation 112 is created by one of back-thinning a thick conductive layer having an initial thickness DMZ+LEH or by providing additional conductive material on top of a thin conductive layer having an initial thickness DMZ, as will be explained in more detail further below. In any case, the base 1122 of the local elevation 112 can be spatially defined by the beginning of the increase of the thickness of metallization 111 that forms the local elevation 112.

The height LEH of the at least one local elevation 112, i.e., the local increase of the depth of the metallization 111, may be within the range of 20% to 50% of the thickness DMZ, within the range of 50% to 100% of the thickness DMZ, or within the range of 100 to 300% of DMZ. For example, LEH may be within the range of 5 μm to 20 μm, or within the range of 20 μm to 100 μm.

In an embodiment, the top width LEW1 of the at least one local elevation 112 can amount to less than 90% of the base width LEW2. The top width LEW1 can be even smaller than 90% of the base width LEW2, e.g., smaller than 80% of the base width LEW2, smaller than 70% of the base width LEW2, or even smaller than 50% of the base width LEW2.

Accordingly, in an embodiment, the base 1122 may have a base area, and the top 1121 may have a top area, wherein the top area can amount to less than 80% of the base area. The top area can be even smaller than 80% of the base area, e.g., smaller than 70% of the base area, smaller than 50% of the base area, or even smaller than 40% of the base area.

In an embodiment, the area of the base 1122 is within the range of 5000 μm² to 10000 μm², within the range of 10000 μm² to 50000 μm², or within the range of 50000 μm² to 100000 μm². Further, the area of the top 1121 can within the range of 3000 μm² to 5000 μm², within the range of 5000 μm² to 20000 m², or within the range of 20000 μm² to 60000 μm².

Figure 3:
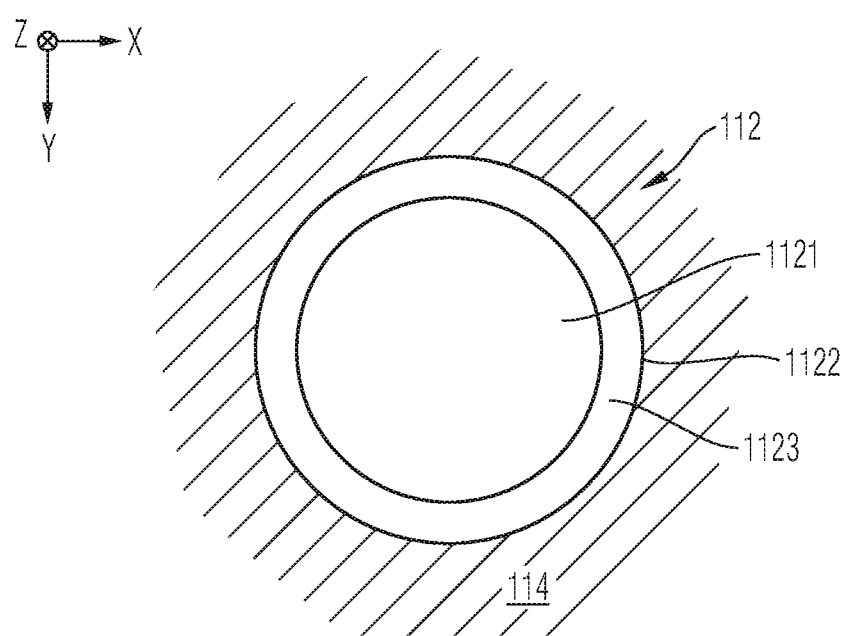
FIG. 3 schematically and exemplarily illustrates a section of a horizontal projection of a first load terminal in accordance with one or more embodiments.

Each of the base area and the top area may be arranged horizontally, e.g., in parallel to each of the first lateral direction X and the second lateral direction Y. This aspect is exemplarily indicated in FIG. 3, which schematically and exemplarily illustrates a section of a horizontal projection of a first load terminal 11 in accordance with one or more embodiments. For example, each of the area of the top 1121 and the base 1122 may exhibit a circular shape. In another embodiment, said areas exhibit a polygonal shape, e.g., a rectangular shape, a quadratic shape, a hexagonal shape or an octagonal shape, wherein the respective corners may be rounded.

In an embodiment, a sidewall 1123 that links the base 1122 to the top 1121 is not entirely in parallel to the extension direction Z (i.e., the vertical direction Z), as illustrated in FIG. 1, but, at least partially, arranged in an angle thereto. This aspect shall now be elucidated with reference to the FIGS. 2A-D, which each schematically and exemplarily illustrate a section of a vertical cross-section of the first load terminal 11 in accordance with one or more embodiments.

For example, half of the difference between the base width LEW2 and the top width LEW1 is equal or greater to the height LEH.

Figure 2A:
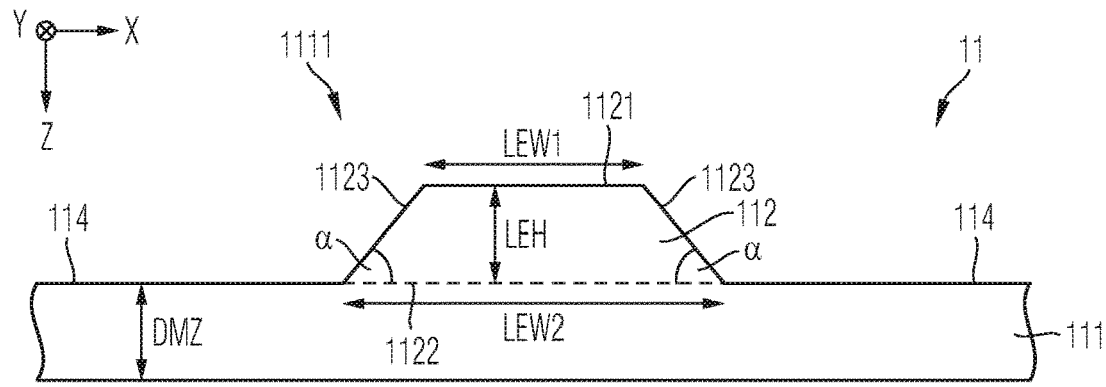
FIGS. 2A-D each schematically and exemplarily illustrate a section of a vertical cross-section of a first load terminal in accordance with one or more embodiments.

Referring to the example of FIG. 2A, the sidewall 1123 can be arranged in angle α to the base area that is smaller than 90°, smaller than 80°, smaller than 60° or equal or smaller than 45°. Further, in an embodiment, the width of the local elevation 112 in the first lateral direction X may gradually increase along the extension direction Z from the top width LEW1 to the base width LEW2. Thus, the sidewall 1123 may form, in a vertical cross-section, a straight line, e.g., for at least 50% of the height LEH of the local elevation 112. In other words, a change of the width of the local elevation 112 in the first lateral direction X over the extension direction Z can be constant for at least 50% of the height LEH of the local elevation 112.

Figure 2B:
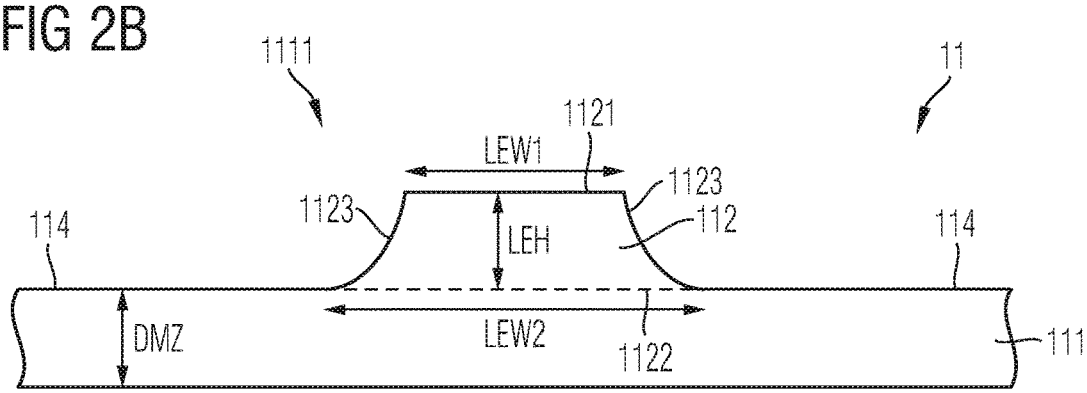

Referring to the example of FIG. 2B, the width of the local elevation 112 may also increase in accordance with a first parabolic or exponential function along the extension direction Z. Such form of increase may be achieved by carrying out at least one etch processing step, as will be explained in more detail below.

Figure 2C:
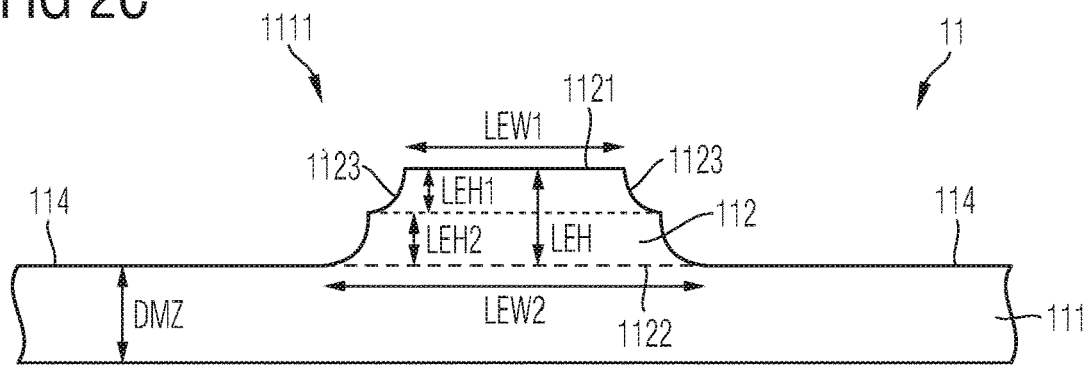

Referring to the example of FIG. 2C, the width of the local elevation 112 may also increase in accordance with a first exponential function for a first percentage share LEH1 of the height LEH, and then increase in accordance with a parabolic or second exponential function for a second percentage share LEH2 of the height LEH. Such form of increase may be achieved by carrying out at least two etch processing steps, as will be explained in more detail below.

Figure 2D:
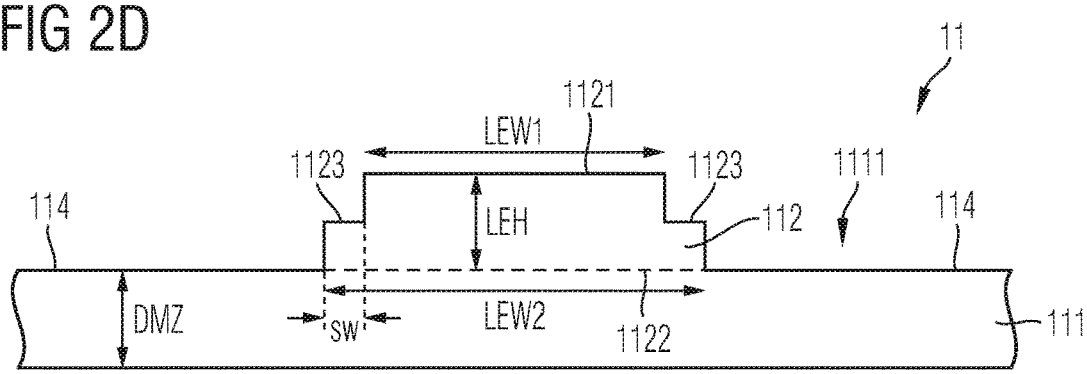

Referring to the example of FIG. 2D, the width of the local elevation 112 in the first lateral direction X may increase step-like along the extension direction Z from the top width LEW1 to the base width LEW2. Thus, the sidewall 1123 may comprise at least one step, wherein the step width SW may amount to at least 2 μm to 10 μm in the first lateral direction X.

In an embodiment, the metallization 111 has a spatially homogenous material composition. Accordingly, the material of the at least one local elevation 112 may be identical to the material of the remaining section of the metallization. For example, such spatially homogeneous material composition may be achieved by forming the at least one local elevation 112 by subjecting an initially thick conductive layer to one or more etch processing steps, as will be explained in more detail below. In another embodiment, the local elevation 112 can be produced by locally providing additional material on top of an initially thin conductive layer, e.g., on top of a substantially planar layer; then, the material present in the local elevation 112 can either be identical or different from the material and the remaining section of the metallization 111, as will also be explained in more detail below.

Figure 5:
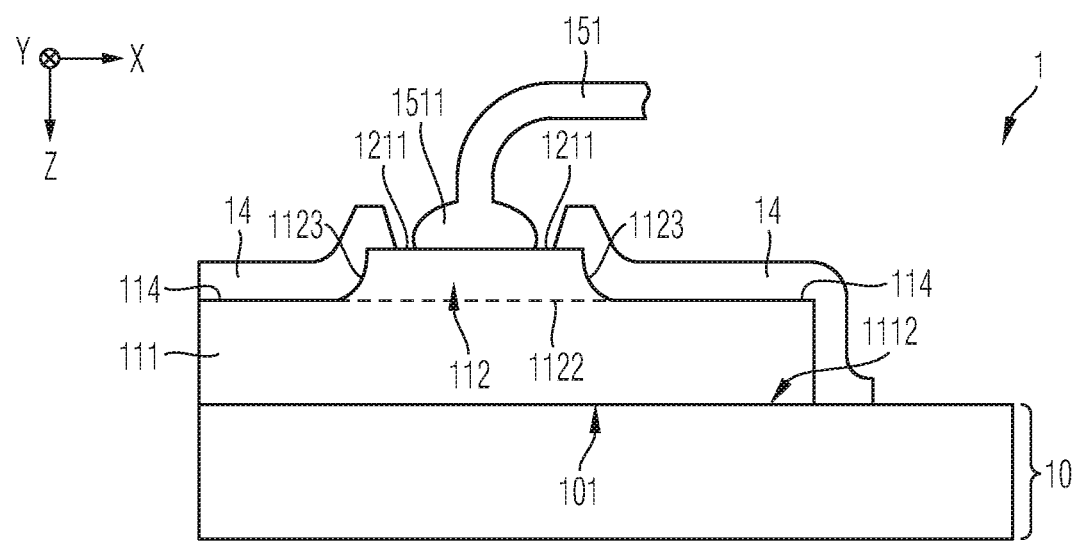

FIGS. 4-5 each schematically and exemplarily illustrate a section of a vertical cross-section of the power semiconductor device 1 in accordance with one or more embodiments. FIG. 4 illustrates three local elevations 112, wherein each of the wires 151 of the wire structure 15 is attached to a respective one of the local elevations 112. The local elevations 112 may be spatially separated from each other by means of recess region 113, wherein such recess region 113 may have been produced by means of carrying out one or more etch processing steps, e.g., by carrying out a back-thinning of an initially thick conductive layer.

As illustrated in FIG. 4, the sidewalls 1123 of the local elevations 112 may correspond to the embodiment as schematically illustrated in FIG. 2C. Accordingly, the recess region 113 may have been created by carrying out at least two etch processing steps. The depths RD of the recess region 113 may be substantially identical to the height of the local elevations 112, and the distance RW in the first letter direction X between adjacent two local elevations 112 may amount to a multiple of the top width LEW1 (cf. FIGS. 1-2D). For example, the distance RW may amount to at least 50 μm, to at least 100 μm, or to at least 500 μm.

In accordance with the embodiment illustrated in FIG. 5, the power semiconductor device 1 can further comprise an insulating encapsulation 14, wherein the encapsulation 14 may cover the base surface 114 and may expose at least a section of the top 1121 of the local elevation 112, e.g., so as to allow attachment of the first end 1511 of the wire 151. The encapsulation 14 may comprise imide. Further, in an embodiment, the encapsulation 14 as well as an exposed section of the top 1121 can be covered by a protection material (not illustrated), e.g., based on epoxy resin that may comprise silicon dioxide subregions.

In the following, embodiments of a method of processing a power semiconductor device will be described. For example, the described methods may allow for producing a power semiconductor device with a first load terminal 11 in accordance with one or more of the embodiments illustrated above. Thus, what has been stated above with regards to features of the embodiments of the power semiconductor device may analogously apply to features of the methods described below.

Generally speaking, a first step of method 2 may comprise providing 20 (cf. FIG. 6) a semiconductor body 10 configured to conduct a load current. A next step may comprise forming a first load terminal 11 electrically connected with the semiconductor body 10 and configured to couple the load current into and/or out of the semiconductor body 10. The first load terminal 11 can comprise a metallization 111 having a frontside 1111 and a backside 1112, the backside 1112 interfacing with a surface 101 of the semiconductor body 10 and the frontside 1111 being configured to interface with a wire structure 15 having at least one wire 151 configured to conduct at least a part of the load current. Forming the first load terminal 11 may include: laterally structuring the frontside 1111 of the metallization 111 by forming at least one local elevation 112 of the metallization 111. The formed at least one local elevation 112 may have a height LEH in an extension direction Z defined by the distance between a base 1122 and a top 1121 of the local elevation 112 and, in a first lateral direction X perpendicular to the extension direction Z, a base width LEW2 at the base 1122 and a top width LEW1 at the top 1121, wherein the local elevation 112 can be formed such that the top width LEW1 amounts to less than 90% of the base width LEW2 (cf. FIG. 1).

Figure 6:
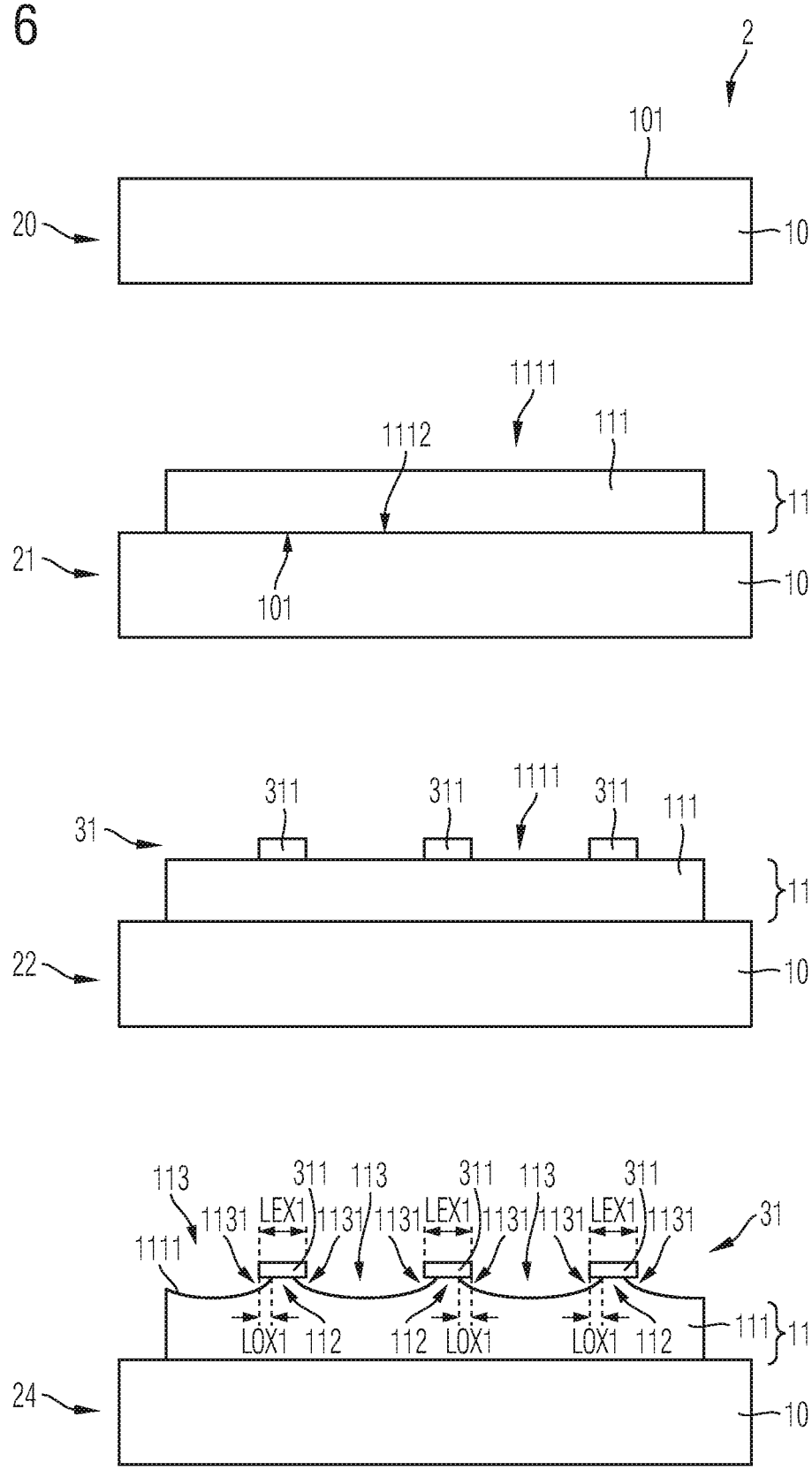
FIG. 6 schematically and exemplarily illustrates a method of processing a power semiconductor device in accordance with one or more embodiments.

Exemplary ways of laterally structuring the frontside 111 will now be explained:

In accordance with the embodiment schematically and exemplarily illustrated in FIG. 6, laterally structuring the frontside 1111 of the metallization 111 includes forming, in step 21, a conductive layer 111 on top of the surface 101 and providing, in a next step 22, a first mask 31 on top of the conductive layer 111. The first mask 31 may include at least one first mask element 311, e.g., made of a resist material. Then, a first etch processing step 24 can be carried out so as to back-thin the conductive layer 111 in sections not covered by the at least one first mask element 311, wherein the created back-thinning 113 of the conductive layer 111 spatially confines the at least one local elevation 112.

For example, the back-thinning 113 has a first lateral overlap LOX1 with the at least one first mask element 311 that amounts to at least 2 μm to 5 μm. In an embodiment, such lateral overlap is achieved by carrying out the first etch processing step 24 as an undercut etch processing step, e.g., a wet etch undercut processing step.

For example, the top width LEW1 of the at least one local elevation 112 can, thus, be smaller than a width LEX1 of the at least one first mask element 311 by at least 2 μm to 5 μm (see, e.g., FIGS. 1 and 2A-2D for illustration of top width LEW1).

In an embodiment, as indicated above, the first lateral overlap LOX1 is formed by means of an etch undercut produced within the first etch processing step 24.

Figure 7:
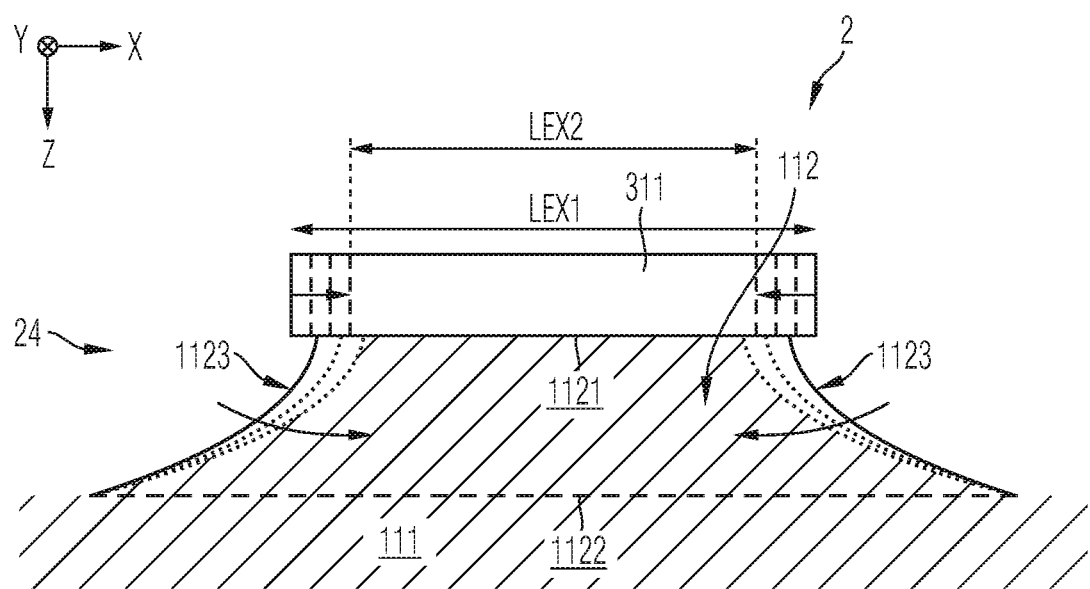
FIG. 7 schematically and exemplarily illustrates a step of a method of processing a power semiconductor device in accordance with one or more embodiments.

Additionally or alternatively, e.g., as illustrated in FIG. 7, during the first etch processing step 24, the lateral extension of the at least one first mask element 311 can be reduced from an initial value LEX1 to an end value LEX2, the end value amounting to less than 90% of the initial value. The initial value LEX1 may be present before carrying out the first etch processing step 24, in the end value LEX2 may be present after carrying out the first etch processing step 24. The end value LEX2 can be even smaller than 90% of the initial value LEX1, e.g., smaller than 80% or even smaller than 70% of the initial value LEX1. Such reduction of the lateral extension of the first mask element 311 is schematically illustrated in FIG. 7 by means of the dotted lines. As becomes apparent, due to such reduction of the lateral extension of the first mask element 311, the incline of the sidewall 1123 linking the top 1121 of the local elevation 122 to its base 1122 can be reduced. For example, in order to achieve the reduction of the lateral extension of the at least one first mask element 311, during the first etch processing step 24, an etchant is used that is configured to etch each of the conductive layer 111 and the at least one mask element 311. For example, such etchant may comprise at least one of an acidic solution for etching the conductive layer 111 and a solvent solution for removing the at least one first mask element 311, e.g., with an additional Oxygen-Plasma strip. In an embodiment, a first material portion of the first etchant is directed to etching the material of the conductive layer 111, and a second material portion of the first etchant is directed to etching the material of the at least one first mask element 311. For example, the first material portion amounts to 80%, and the second material portion to 20%. Other variations in the percentage share are certainly possible. Further, the material portions may change during the first etch processing step; i.e., in an embodiment, the etchant is changed during the etch processing step.

In addition, it shall be understood that both embodiments—undercut etching and reducing the lateral extension of the at least one first mask element 311—may be combined with each other.

Figure 8:
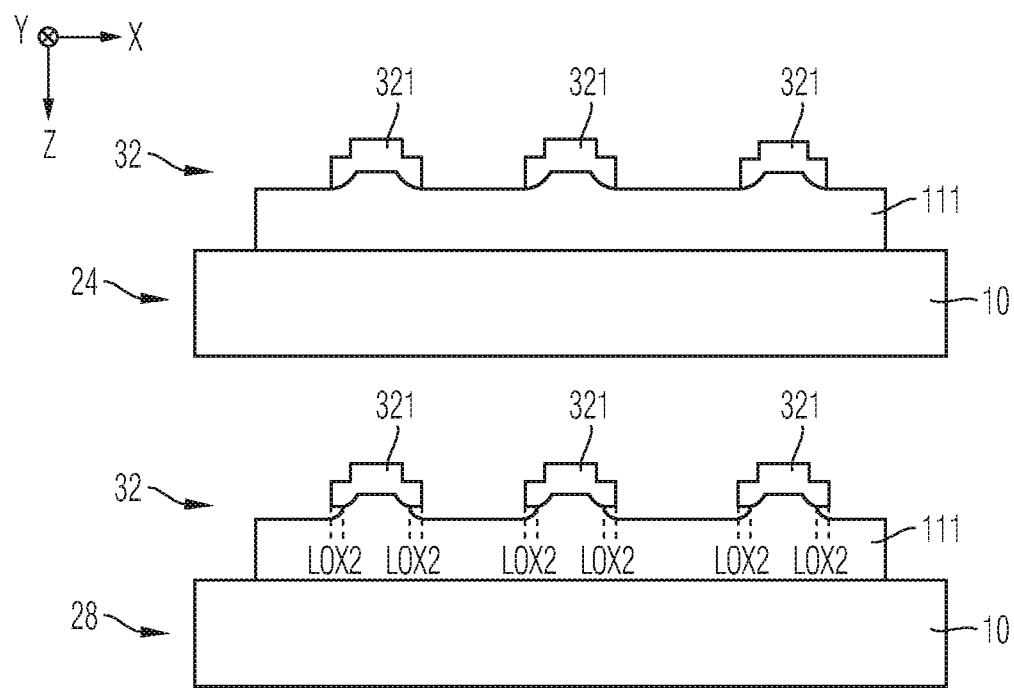
FIGS. 8-9 each schematically and exemplarily illustrate steps of a method of processing a power semiconductor device in accordance with one or more embodiments.

Now referring to FIG. 8, in a further embodiment, after carrying out the first etch processing step 24, in step 26, at least one second mask element 321 of a second mask 32 can be provided in a recess section 1131 (cf. FIG. 6) caused by the first lateral overlap LOX1. Then, a second etch processing step 28 can be carried out so as to further back-thin the conductive layer 111 in sections not covered by the at least one second mask element 321, wherein the created back-thinning 113 of the conductive layer 111 can spatially confine the at least one local elevation 112, and wherein the back-thinning 113 can exhibit a second lateral overlap LOX2 with the at least one second mask element 321 that amounts to at least 2 µm to 5 µm. Thereby, the local elevation 112 may be created with a sidewall as also schematically illustrated in FIG. 2C. For example, the second lateral overlap LOX2 may be formed by means of an etch undercut produced within the second etch processing step 28, which may hence be, e.g., a wet etch undercut processing step. For example, such steps may be repeated with different mask elements so as to further reduce the incline of the sidewall 1123.

Figure 9:
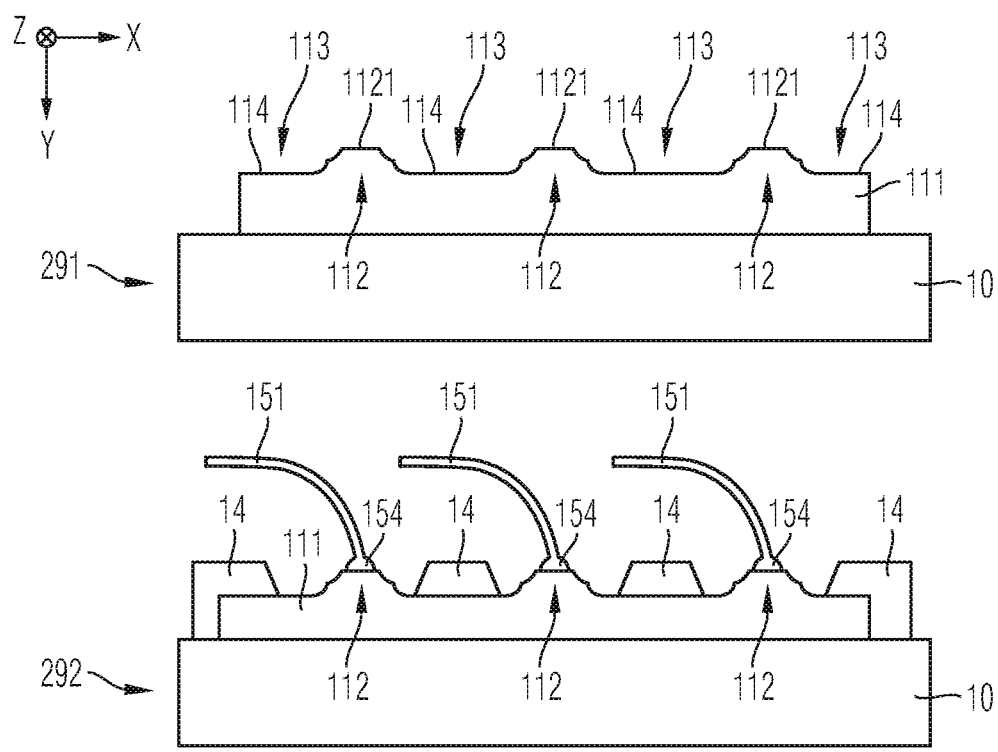

As schematically illustrated in FIG. 9, the mask elements may be removed in step 291 so to expose the top areas 1121 of the local elevations 112. For example, an annealing step, e.g., a copper annealing step, may then be carried out. Then, in step 292, the wires 151 may be attached to the local elevations 112, e.g., by carrying out bonding processing step, e.g., a ball-bonding processing step. Further, an encapsulation 14 may be provided, exemplary features of which are described further below.

Figure 10:
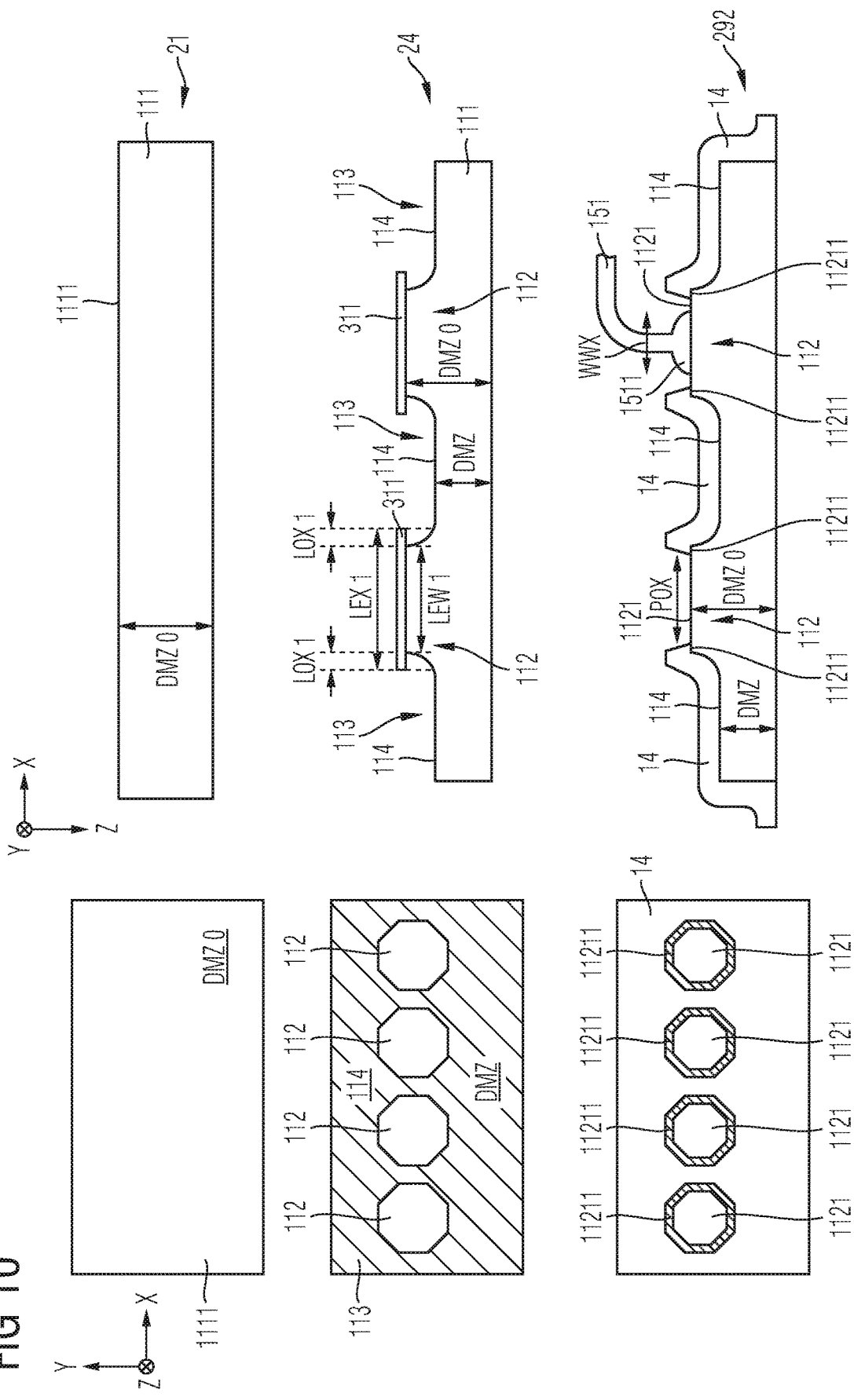
FIG. 10 schematically and exemplarily illustrates steps of a method of processing a power semiconductor device in accordance with one or more embodiments.

FIG. 10 schematically and exemplarily illustrates some of the aforementioned steps. The left section of FIG. 10 shows horizontal projections corresponding to the vertical cross-sections illustrated in the right section of FIG. 10. For example, the conductive layer 111 that may be formed on top of the surface 101 of the semiconductor body 10 may exhibit an initial thickness DMZO and the frontside 1111, which may be initially planar. For example, the initial thickness DMZO amounts to about 15 µm. The first mask 31 with the first mask elements 311 may be formed on top of the frontside 1111 of the conductive layer 111. As illustrated in the left section, the first mask elements 311 may each exhibit an octagonal shape. Due to the first etch processing step 24, the conductive layer 111 is back-thinned. As has been explained above, the first etch processing step 24 can be carried out as an undercut etch processing step such that said lateral overlap LOX1 is created. The back-thinning 113 may render the base surface 114, wherein, in this section, the conductive layer 111 may exhibit said thickness DMZ, which may amount to approximately 11 µm. In step 292, the encapsulation 14 may be provided and the wires 151 may be attached to the tops 1121 of the local elevations 112. For example, the encapsulation 14 is provided such that it also covers a respective edge region 11221 of the tops 1121 of the local elevations 112. For example, the edge regions 11221 exhibit a respective lateral width of at least some µm, e.g., of at least 3 µm. The remaining sections of the tops 112 may form a pad opening configured to be contacted by a respective first end 1511 of a wire 151. Such pad openings may exhibit a lateral width POX of, e.g., at least 150 µm, in accordance with an embodiment. For example, the end 1511 of the wire 151 may exhibit lateral width WWX smaller than the pad opening width POX so to allow for positioning the end 1511 spatially apart from, i.e., not in contact with the encapsulation 14, as illustrated in FIG. 10.

Figure 11:
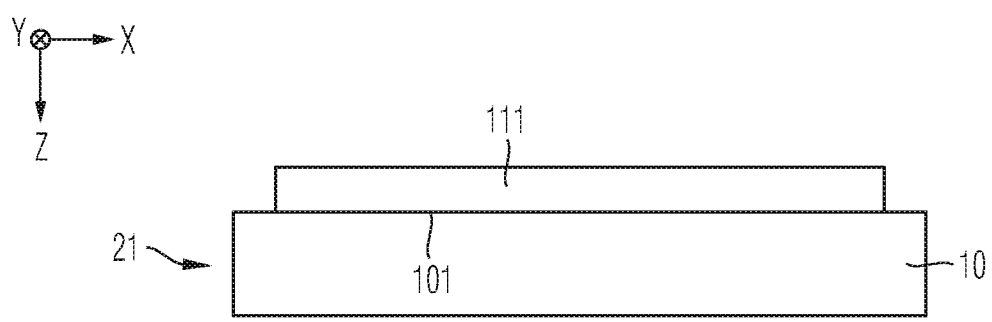
FIG. 11 schematically and exemplarily illustrates a method of processing a power semiconductor device in accordance with one or more embodiments.
Figure 11:
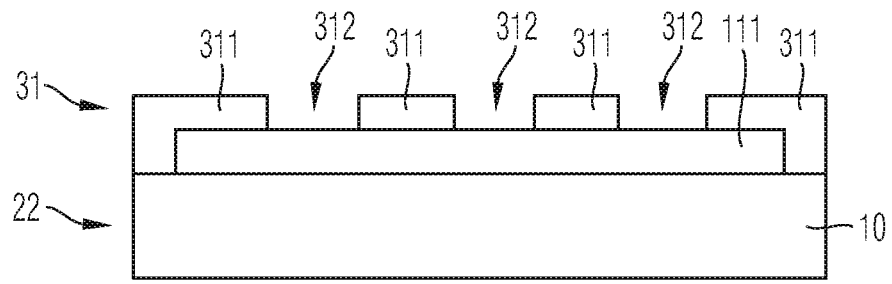
Figure 11:
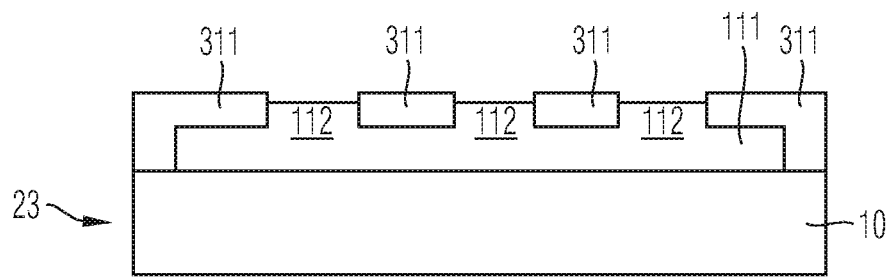

Now referring to FIG. 11, in another embodiment, laterally structuring the frontside 1111 of the metallization 111 includes: forming, in step 21, a conductive layer 111 on top of the surface 101 by means of carrying out a first electroplating processing step; providing, in step 22, a first mask 31 on top of the conductive layer 111, the first mask 31 including at least one first mask element 311 that spatially confines at least one first opening 312; carrying out a second electroplating processing step 23 so as to fill the at least one first opening 312 with a conductive material, thereby forming the at least one local elevation 112.

For example, the first and the second electroplating processing steps are carried out with the same material such that there is no material barrier between the local elevation 112 and the remaining section of the metallization 111. For example, the same bath is used for carrying out the first and the second electroplating processing steps.

Figure 12:
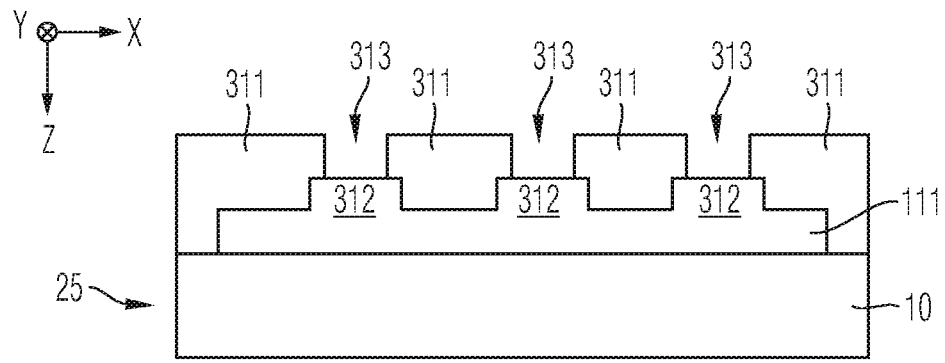
FIGS. 12-13 each schematically and exemplarily illustrate steps of a method of processing a power semiconductor device in accordance with one or more embodiments.
Figure 12:
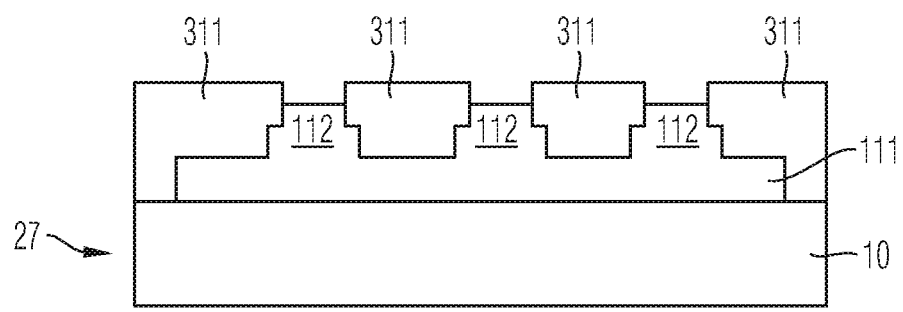

No additionally referring to FIG. 12, in a yet another embodiment, laterally structuring the frontside 1111 of the metallization 111 includes: forming, in step 21, a conductive layer 111 on top of the surface 101; providing, in step 22, a first mask 31 on top of the conductive layer 111, the first mask 31 including at least one first mask element 311 that spatially confines at least one first opening 312; filling 23 the at least one first opening 312 with a conductive material; providing, in step 25, at least one second mask element 321 on top of the at least one first mask element 311, the at least one second mask element 321 laterally overlapping with the filled at least one first opening 312 and defining at least one second recess 313; and filling, in step 27, the at least one second opening 313 with a conductive material, thereby forming the at least one local elevation 112.

For example, in this way, a local elevation 112 may be formed that has sidewalls 1123 as schematically and exemplarily illustrated in FIG. 2D. For example, forming (step 21) the conductive layer 111, filling the at least one first opening 312 and filling the at least one second opening 313 include carrying out a respective electroplating processing step.

Further, said electroplating processing steps can be carried out with the same material, e.g., by using the same bath, such that there is neither a material barrier within the local elevation 112 itself nor between the local elevation 112 and the remaining section of the metallization 111.

Further, the aforementioned steps may be repeated, so as to create sidewalls 1123 with a small mean incline, in accordance with an embodiment.

Figure 13:
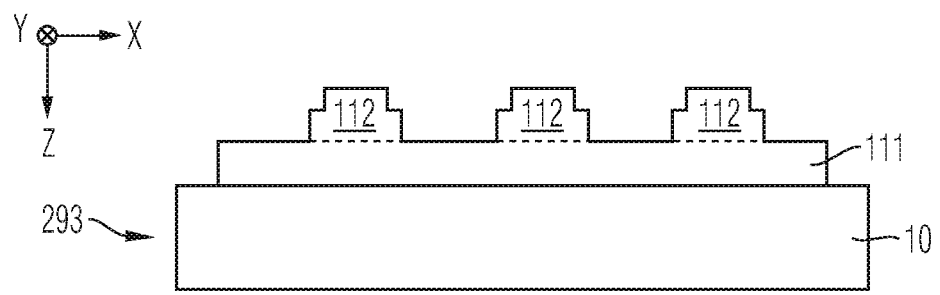
Figure 13:
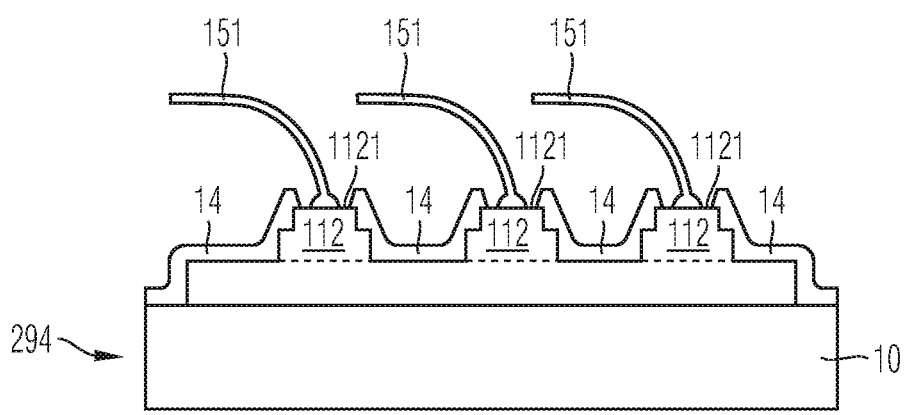

Now referring additionally to FIG. 13, the mask elements 312/321 may be removed after said filling steps (cf. step 293) and, subsequently, in step 294, the encapsulation 14 may be provided and the wires 151 may be attached to the tops 1121 of the created local elevations 112.

Figure 14:
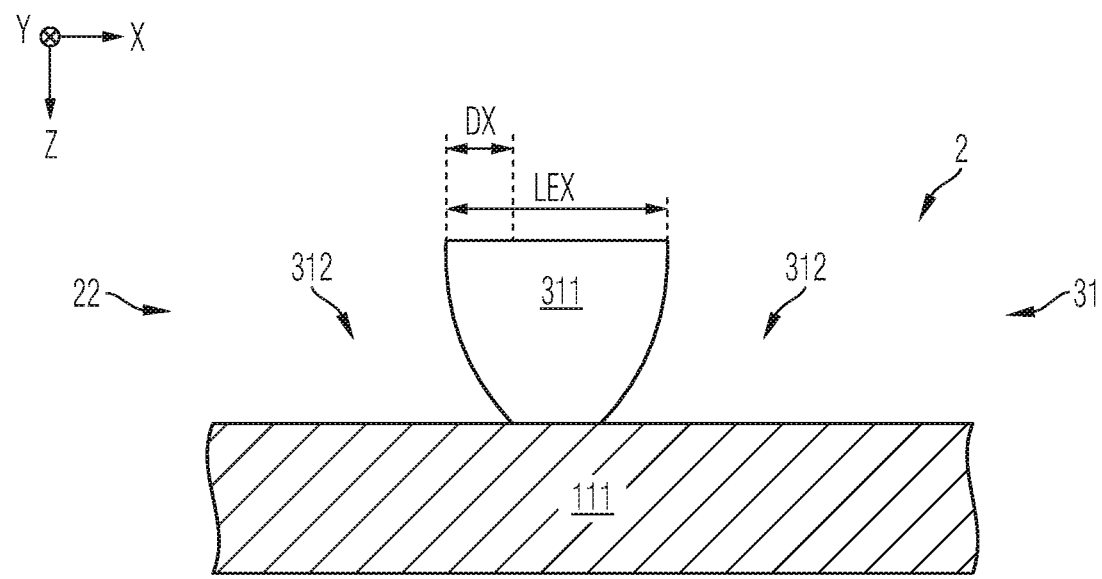
FIG. 14 schematically and exemplarily illustrates steps of a method of processing a power semiconductor device in accordance with one or more embodiments.
Figure 14:
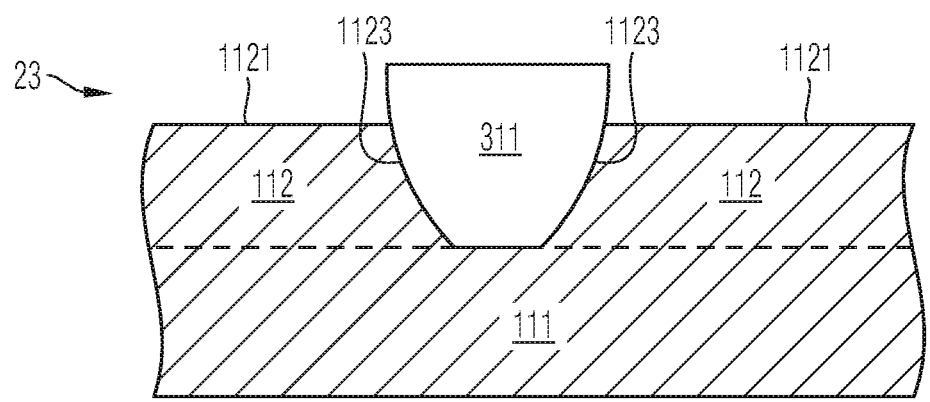

FIG. 14 schematically and exemplarily illustrates a step of a method of processing a power semiconductor device in accordance with one or more embodiments. There, laterally structuring the frontside 1111 of the metallization 111 includes: forming, in step 21, a conductive layer 111 on top of the surface 101 of the semiconductor body 10 (not illustrated in FIG. 14); and providing, in step 22 a first mask 31 on top of the conductive layer 111. The first mask 31 includes at least one first mask element 311 that spatially confines at least one first opening 312. The at least one first mask element 311 has a width LEX that decreases along the extension direction Z. In an embodiment, such decrease in width amounts to at least 10% of a maximum value of the width LEX. In step 23, the at least one first opening 312 is filled with a conductive material, thereby forming the at least one local elevation 112. Said filling may comprise carrying out an electroplating processing step.

Accordingly, the width LEX can be a function of the extension direction Z, i.e., LEX=LEX (Z) in accordance with an embodiment. For example, LEX (Z) can be a linear function, e.g., so to create local elevations 112 in accordance with the embodiment schematically illustrated in FIG. 2A. In another embodiment, LEX (Z) can be based on one or more exponential functions, e.g., so to create local elevations 112 in accordance with the embodiments schematically illustrated in FIGS. 2B-C. In yet another embodiment, LEX (Z) may be equal to a first constant value for a first percentage share its height and equal to a second constant value for a second percentage share of its height, e.g., so to create local elevations 112 in accordance with the embodiment schematically illustrated in FIG. 2D.

The decrease DX of the width LEX of the first mask element 311 may amount to at least 2 µm, to at least 5 µm, or to even more than 5 µm. For example, the difference between the base width LEW1 and the top width LEW2 of the at least one local elevation 112 amounts to at least the value of the width decrease of the at least one first mask element 311.

The embodiments described above include the recognition that high temperature gradients may be come into being in proximity to transition formed between a bondwire and the planar frontside metallization during operation of the power semiconductor device, e.g., during switching. Such high temperature gradients may induce mechanical stress to the metallization and may thus even reduce the entire lifetime of the power semiconductor device.

In accordance with one or more embodiments, the development of high temperature gradients is diminished due to the number of local elevations 112 comprising a respective profiled sidewall 1123 that is not entirely arranged perpendicular to the horizontal plane, wherein the number of local elevations 112 that form the lateral structure of a frontside metallization of the power semiconductor device 1. The profiled, e.g., angled sidewalls 1123 may provide for a more homogeneous spatial temperature distribution that has low spatial temperature gradients, thereby reducing the mechanical stress. For example, the local elevations 112 do not comprise any right-angled corners.

In the above, embodiments pertaining to semiconductor device processing methods were explained. For example, these semiconductor devices are based on silicon (Si). Accordingly, a monocrystalline semiconductor region or layer, e.g., the semiconductor body 10 can be a monocrystalline Si-region or Si-layer. In other embodiments, polycrystalline or amorphous silicon may be employed.

It should, however, be understood that the semiconductor body 10 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a power semiconductor device, the method comprising:
   providing a semiconductor body configured to conduct a load current;
   forming a first load terminal electrically connected with the semiconductor body and configured to couple the load current into and/or out of the semiconductor body, wherein the first load terminal comprises a metallization having a frontside and a backside, the backside interfacing with a surface of the semiconductor body and the frontside being configured to interface with a wire structure having at least one wire configured to conduct at least a part of the load current, wherein forming the first load terminal further comprises:
   laterally structuring the frontside of the metallization by forming at least one local elevation of the metallization so that the metallization has a local increase of depth in a region of the at least one local elevation and a lesser, non-zero depth outside the region of the at least one local elevation, the at least one local elevation having a height in an extension direction defined by the distance between a base and a top of the local elevation and, in a first lateral direction perpendicular to the extension direction, a base width at the base and a top width at the top, wherein the at least one local elevation is formed such that the top width amounts to less than 90% of the base width, wherein there is neither a material barrier within the at least one local elevation itself nor between the at least one local elevation and a remaining section of the metallization outside the region of the at least one local elevation.

2. The method of claim 1, wherein laterally structuring the frontside of the metallization comprises:
   forming a conductive layer on top of the surface;
   providing a first mask on top of the conductive layer, the first mask including at least one first mask element;

carrying out a first etch processing step to back-thin the conductive layer in sections not covered by the at least one first mask element, wherein the back-thinning of the conductive layer spatially confines the at least one local elevation, and wherein the back-thinning has a first lateral overlap with the at least one first mask element that amounts to at least 1 µm.

3. The method of claim 2, wherein the top width of the at least one local elevation is smaller than a width of the at least one first mask element by at least 1 µm.

4. The method of claim 2, wherein the first lateral overlap is formed by means of an etch undercut produced within the first etch processing step.

5. The method of claim 2, wherein, during the first etch processing step, the lateral extension of the at least one first mask element is reduced from an initial value to an end value, the end value amounting to less than 90% of the initial value.

6. The method of claim 2, wherein, during the first etch processing step, an etchant is used that is configured to etch each of the conductive layer and the at least one mask element.

7. The method of claim 2, further comprising, after carrying out the first etch processing step:
providing at least one second mask element in a recess section caused by the first lateral overlap; and
carrying out a second etch processing step to further back-thin the conductive layer in sections not covered by the at least one second mask element, wherein the further back-thinning of the conductive layer spatially confines the at least one local elevation, and wherein the further back-thinning has a second lateral overlap with the at least one second mask element that amounts to at least 1 µm.

8. The method of claim 7, wherein the second lateral overlap is formed by means of an etch undercut produced within the second etch processing step.

9. The method of claim 1, wherein laterally structuring the frontside of the metallization comprises:
forming a conductive layer on top of the surface by a first electroplating processing step;
providing a first mask on top of the conductive layer, the first mask including at least one first mask element that spatially confines at least one first opening; and
carrying out a second electroplating processing step to fill the at least one first opening with a conductive material, thereby forming the at least one local elevation.

10. The method of claim 1, wherein laterally structuring the frontside of the metallization comprises:
forming a conductive layer on top of the surface;
providing a first mask on top of the conductive layer, the first mask including at least one first mask element that spatially confines at least one first opening;
filling the at least one first opening with a conductive material;
providing at least one second mask element on top of the at least one first mask element, the at least one second mask element laterally overlapping with the filled at least one first opening and defining at least one second opening; and
filling the at least one second opening with a conductive material, thereby forming the at least one local elevation.

11. The method of claim 10, wherein forming the conductive layer, filling the at least one first opening and filling the at least one second opening each comprise carrying out a respective electroplating processing step.

12. The method of claim 1, wherein laterally structuring the frontside of the metallization comprises:
forming a conductive layer on top of the surface;
providing a first mask on top of the conductive layer, the first mask including at least one first mask element that spatially confines at least one first opening, wherein the at least one first mask element has a width that decreases along the extension direction; and
filling the at least one first opening with a conductive material, thereby forming the at least one local elevation.

13. The method of claim 12, wherein the difference between the base width and the top width of the at least one local elevation amounts to at least the value of the width decrease of the at least one first mask element.

* * * * *